(12) United States Patent
Ninomiya

(10) Patent No.: US 9,857,774 B2
(45) Date of Patent: Jan. 2, 2018

(54) SEMICONDUCTOR DEVICE AND ELECTRONIC TIMEPIECE

(71) Applicant: SEIKO EPSON CORPORATION, Tokyo (JP)

(72) Inventor: Masaya Ninomiya, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 15/149,287

(22) Filed: May 9, 2016

(65) Prior Publication Data

US 2017/0017207 A1 Jan. 19, 2017

(30) Foreign Application Priority Data

Jul. 14, 2015 (JP) ................................. 2015-140726

(51) Int. Cl.
| | |
|---|---|
| *G04G 19/00* | (2006.01) |
| *G04G 19/06* | (2006.01) |
| *G04F 5/04* | (2006.01) |
| *H03L 3/00* | (2006.01) |
| *G05F 3/16* | (2006.01) |

(52) U.S. Cl.
CPC ............... *G04G 19/06* (2013.01); *G04F 5/04* (2013.01); *G04G 19/00* (2013.01); *G05F 3/16* (2013.01); *H03L 3/00* (2013.01)

(58) Field of Classification Search
CPC .......... G04C 10/00; G04G 3/00; G04G 19/00; G04G 19/02; G04G 19/06; G04F 5/04; H03B 5/30; H03B 5/32
See application file for complete search history.

(56) References Cited

U.S. PATENT DOCUMENTS

| | | | | |
|---|---|---|---|---|
| 4,328,571 A | * | 5/1982 | Noble | G04G 19/00 331/116 FE |
| 4,387,350 A | * | 6/1983 | Bessolo | G04G 19/00 331/116 FE |
| 4,395,138 A | * | 7/1983 | Chihara | G04C 10/00 368/204 |
| 6,061,304 A | | 5/2000 | Nagata et al. | |
| 6,757,220 B1 | | 6/2004 | Nakamura et al. | |
| 6,956,794 B2 | | 10/2005 | Nakamura et al. | |
| 7,583,565 B2 | * | 9/2009 | Ogasawara | G04F 5/04 331/158 |
| 7,660,975 B2 | | 2/2010 | Nakamura et al. | |
| 2013/0250741 A1 | * | 9/2013 | Mitani | G04G 3/00 368/160 |

FOREIGN PATENT DOCUMENTS

| | | |
|---|---|---|
| JP | 2006-153669 A | 6/2006 |
| WO | 98/06013 A1 | 2/1998 |
| WO | 00/17716 A1 | 3/2000 |

* cited by examiner

*Primary Examiner* — Vit W Miska
(74) *Attorney, Agent, or Firm* — Global IP Counselors, LLP

(57) ABSTRACT

A semiconductor device includes: a secondary battery; a constant voltage generation circuit that is driven in accordance with the secondary battery; a control logic circuit that is driven with a constant voltage generated by the constant voltage generation circuit and controls the constant voltage generation circuit; and a starting circuit that outputs a control signal for operating the constant voltage generation circuit in correspondence to an initialization signal input from outside in a case in which the constant voltage generation circuit is stopped.

6 Claims, 2 Drawing Sheets

SEMICONDUCTOR DEVICE AND ELECTRONIC TIMEPIECE

BACKGROUND

1. Technical Field

The present invention relates to a semiconductor device and an electronic timepiece.

2. Related Art

Electronic timepieces such as wristwatches drive semiconductor devices in which electronic circuits are embedded using primary batteries or rechargeable secondary batteries as power supplies. To realize energy saving in electronic timepieces, there is known control reliably performed such that constant voltages ensuring normal operations of the semiconductor devices are generated by constant voltage generation circuits and power of the voltages is supplied to constant voltage driving circuits including oscillation circuits or CPUs (for example, see JP-A-2006-153669).

Incidentally, when a power supply voltage is reduced, a constant voltage generated by a constant voltage generation circuit is also reduced, becomes less than a minimum driving voltage of an oscillation circuit or a CPU, and thus an operation of the constant voltage driving circuit such as an oscillation circuit becomes unstable or is stopped. Thus, it is desirable to provide a constant voltage control circuit that stops the constant voltage generation circuit when the power supply voltage is reduced and that operates the constant voltage generation circuit when a power supply voltage is increased by exchanging a primary battery or recharging a secondary battery.

The constant voltage control circuit is driven with a power supply voltage. However, to realize further energy saving, the constant voltage control circuit is considered to be driven with a constant voltage generated by the constant voltage generation circuit.

However, when the constant voltage control circuit is driven with the constant voltage of the constant voltage generation circuit, the power supply voltage is reduced. Thus, when the constant voltage generation circuit is stopped and the constant voltage generation circuit does not operate, the constant voltage control circuit does not operate either. Therefore, a so-called deadlock state occurs, and thus a new problem may occur in that the constant voltage control circuit and the constant voltage generation circuit do not operate.

SUMMARY

An advantage of some aspects of the invention is to provide a semiconductor device capable of driving a constant voltage control circuit with a constant voltage of a constant voltage generation circuit and operating the constant voltage generation circuit in a stopped state and an electronic timepiece including the semiconductor device.

A semiconductor device according to an aspect of the invention includes: a constant voltage generation circuit that is driven in accordance with a power supply; a constant voltage control circuit that is driven with a constant voltage generated by the constant voltage generation circuit and controls the constant voltage generation circuit; and a starting circuit that outputs a control signal for operating the constant voltage generation circuit in correspondence to an initialization signal input from outside in a case in which the constant voltage generation circuit is stopped.

According to the aspect of the invention, the constant voltage control circuit controlling the constant voltage generation circuit is driven in accordance with constant voltage generated by the constant voltage generation circuit. Therefore, the constant voltage control circuit can be driven with the voltage lower than a power supply voltage, and thus power consumption can be reduced.

The starting circuit outputting the control signal operating the constant voltage generation circuit in correspondence to the initialization signal input from the outside of the semiconductor device is provided. Therefore, when the constant voltage generation circuit is stopped, the initialization signal is input from the outside of the semiconductor device, the control signal can be output from the starting circuit, and thus the constant voltage generation circuit can be operated. Accordingly, even when the constant voltage generation circuit and the constant voltage control circuit are in a deadlock state, the control signal can be output from the starting circuit separate from the constant voltage control circuit and the constant voltage generation circuit can be operated reliably.

When the constant voltage generation circuit operates, the constant voltage control circuit also operates. Therefore, the starting circuit may have only a function of outputting a control signal in correspondence to input of the initialization signal. Therefore, even when the starting circuit is driven with the power supply voltage, power consumption is small. Therefore, by driving the constant voltage control circuit with the constant voltage, power saving can be realized in the entire semiconductor device.

It is preferable that the semiconductor device according to the aspect of the invention further includes an oscillation circuit that is driven with the constant voltage generated by the constant voltage generation circuit, and the constant voltage generation circuit is configured to be able to switch between a first voltage and a second voltage higher than the first voltage to generate the voltage as the constant voltage, generates the second voltage when the control signal is input from the starting circuit, and switches the second voltage to the first voltage after a predetermined time passes.

According to the aspect of the invention with this configuration, the constant voltage generation circuit can generate the first voltage for a normal operation and the second voltage for operation start higher than the first voltage. The constant voltage generation circuit first generates the second voltage when the control signal is input from the starting circuit. Therefore, the second voltage higher than the first voltage can be applied to the oscillation circuit, and the oscillation circuit can be operated early and reliably. Since the constant voltage generation circuit switches the generated constant voltage from the second voltage to the first voltage after a predetermined time passes. Therefore, the oscillation circuit can enter a normal operation state, and thus power consumption can be reduced.

An electronic timepiece according to another aspect of the invention includes the semiconductor device.

Since the electronic timepiece according to the aspect of the invention includes the semiconductor device, power saving can be realized and a duration time can be lengthened.

It is preferable that the electronic timepiece according to the aspect of the invention includes a manipulation member; and an initialization signal output unit that outputs the initialization signal to the starting circuit according to a manipulation of the manipulation member.

According to the aspect of the invention with this configuration, when a user manipulates the manipulation member such as a winding knob or a button, the initialization signal is output from the initialization signal output unit. The initialization signal is input to the starting circuit of the semiconductor device and the starting circuit outputs the control signal to the constant voltage generation circuit.

Accordingly, in a case in which the constant voltage generation circuit and the constant voltage control circuit are stopped due to a reduction in the power supply voltage or the like, the user can manipulate the manipulation member such as a winding knob or a button, so that the constant voltage generation circuit operates. Accordingly, the constant voltage control circuit, the oscillation circuit, or the like can operate. In a case in which the constant voltage generation circuit is stopped, the oscillation circuit or the like is also stopped and driving of pointers is also stopped. In this case, the user exchanges a primary battery or recharges a secondary battery and further manipulates the manipulation member to match the pointers to a current time. Since the user manipulation of matching the pointers to the current time is a manipulation of outputting the initialization signal and the user may not necessary perform a special manipulation, operability can be prevented from deteriorating.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electronic timepiece 1 including a semiconductor device 10 according to the invention will be described.

Figure 1:
FIG. 1 is a front view illustrating an electronic timepiece according to the invention.

As illustrated in FIG. 1, the electronic timepiece 1 is a wristwatch mounted on a wrist of a user and includes an exterior case 2, a discoid letter plate 3, a movement (not illustrated), a second hand 5, a minute hand 6, and an hour hand 7 driven by a motor provided inside the movement, and a winding knob 8 which is a manipulation member.

Figure 2:
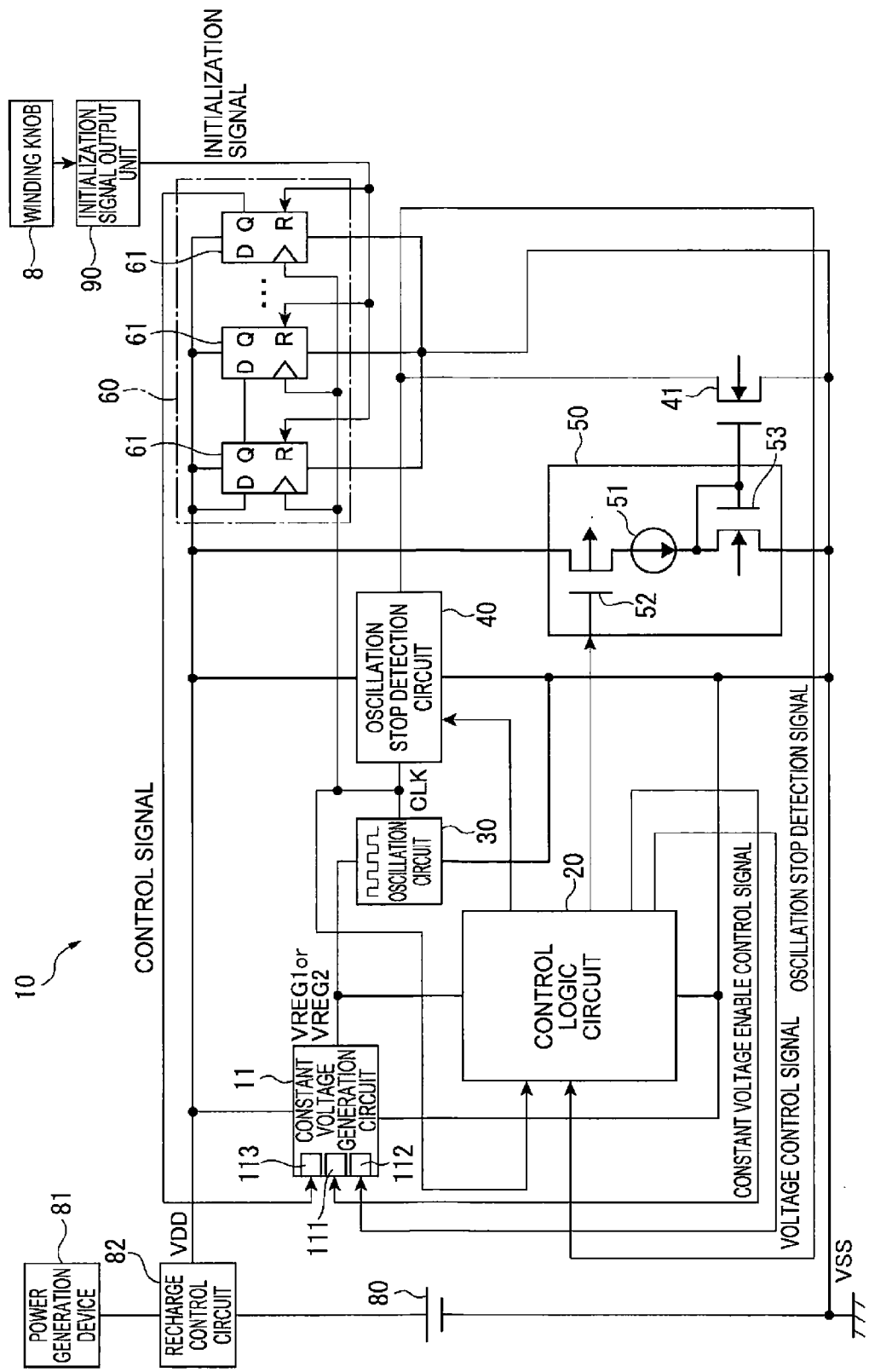
FIG. 2 is a circuit diagram illustrating main units of a semiconductor device according to the invention.

In the electronic timepiece 1, as illustrated in FIG. 2, a secondary battery 80 which is a power supply, and a power generation device 81 and a recharge control circuit 82 recharging the secondary battery 80. Any of various power generation devices used for a watch can be used as the power generation device 81. For example, a rotary power generation device that generates kinetic energy with a rotary weight or the like and rotates a rotor with the kinetic energy to generate power or a solar power generation device that captures light energy with a solar panel or the like to generate power can be used. The power supply is not limited to the secondary battery 80, but a button type primary battery can also be used.

The movement includes a circuit substrate (not illustrated) and a semiconductor device (a semiconductor element or an IC) 10 according to the invention is mounted on the circuit substrate.

As illustrated in FIG. 2, the semiconductor device 10 includes a constant voltage generation circuit 11, a control logic circuit 20, an oscillation circuit 30, an oscillation stop detection circuit 40, a constant current generation circuit 50, and a starting circuit 60. The constant voltage generation circuit 11, the oscillation stop detection circuit 40, the constant current generation circuit 50, and the starting circuit 60 are connected to power supply lines (a power supply line for a voltage VDD and a power supply line for a voltage VSS) of the secondary battery 80 to be driven.

The constant voltage generation circuit 11 generates constant voltages lower than the voltage VDD and supplies the constant voltages to the control logic circuit 20 and the oscillation circuit 30. In the embodiment, the constant voltage generation circuit 11 generates two-level constant voltages, a first voltage VREG1 and a second voltage VREG2 higher than the first voltage VREG1. The voltage values of the first voltage VREG1 and the second voltage VREG2 are set appropriately according to the oscillation circuit 30 or the like applying a constant voltage. For example, the first voltage VREG1 is set in the range of about 0.9 V to about 1.0 V and the second voltage VREG2 is set in the range of about 1.2 V to about 1.3 V.

The constant voltage generation circuit 11 includes a control terminal 111 to which a constant voltage enable control signal is input from the control logic circuit 20 to be described below, a control terminal 112 to which a voltage control signal is input, and a control terminal 113 to which a control signal is input from the starting circuit 60.

The control logic circuit 20 switches the constant voltage enable control signal and the voltage control signal as two-level voltages between a high level (hereinafter referred to as an H level) and a low level (hereinafter referred to as an L level) and outputs the control signal.

For example, the constant voltage generation circuit 11 enters an operation state when the signal with the L level is input to the control terminal 111, and enters a stop state when the signal with the H level is input.

For example, the constant voltage generation circuit 11 generates the first voltage VREG1 as a constant voltage when the signal with the H level is input to the control terminal 112, and generates the second voltage VREG2 as a constant voltage when the signal with the L level is input.

In the embodiment, one constant voltage generation circuit 11 is provided to apply a common constant voltage to the control logic circuit 20 and the oscillation circuit 30, but different constant voltage generation circuits may be provided for each of the circuits.

The oscillation circuit 30 includes a crystal quartz vibrator and outputs a clock signal (CLK) with a predetermined frequency. The oscillation circuit 30 operates early and reliably by applying the second voltage VREG2 at the time of stop. When an operation starts, the oscillation circuit 30 can continue operating by applying the first voltage VREG1 lower than the second voltage VREG2.

The control logic circuit 20 is configured with a gate array and operates with a clock signal supplied from the oscillation circuit 30. An oscillation stop detection signal output from the oscillation stop detection circuit 40 is input to the control logic circuit 20.

The control logic circuit 20 outputs control signals to the constant voltage generation circuit 11, the oscillation stop detection circuit 40, and the constant current generation circuit 50. That is, the control logic circuit 20 outputs the constant voltage enable control signal and the voltage control signal described above to the constant voltage generation circuit 11 and outputs control signals to the oscillation stop detection circuit 40 and the constant current generation circuit 50 to control operations of the circuits. Accordingly, the control logic circuit 20 is a constant voltage control circuit that controls the constant voltage generation circuit 11.

The control logic circuit 20 changes the voltage control signal from the L level (for the second voltage) to the H level (for the first voltage) when the fact that a stop state of the oscillation circuit 30 is released is notified using the oscillation stop detection signal from the oscillation stop detection circuit 40, as will be described below. Therefore, the constant voltage generated by the constant voltage generation circuit 11 is changed into the first voltage VREG1.

An operation of the oscillation stop detection circuit 40 is controlled with the control signal input from the constant voltage generation circuit 11. The oscillation stop detection circuit 40 may be a circuit that can detect the oscillation stop of the oscillation circuit 30 and can be configured, for example, by combining a transistor functioning as a switch and a capacitor (capacitance element). The oscillation stop detection circuit 40 outputs the oscillation stop detection signal to the control logic circuit 20 when the oscillation circuit 30 is stopped.

When the oscillation stop detection signal is input, the control logic circuit 20 outputs the constant voltage enable control signal and the voltage control signal to the constant voltage generation circuit 11, causes the constant voltage generation circuit 11 in an operation state to generate the second voltage VREG2, and starts oscillation of the oscillation circuit 30.

A switch 41 configured by an n-channel transistor or the like to discharge electric charges of the capacitor in the oscillation stop detection circuit 40 is connected to the oscillation stop detection circuit 40. The switch 41 is considered to be turned on in a case in which the constant current generation circuit 50 operates.

The constant current generation circuit 50 includes a constant current source 51, and switches 52 and 53 configured by p-channel transistors or n-channel transistors, or the like.

The switch 52 is controlled with the control signal from the control logic circuit 20 such that the switch 52 can be turned on or off. In a case in which the constant voltage generation circuit 11 is stopped, the switch 52 is controlled such that the switch 52 is also turned off, and thus the switch 53 is also turned off. Therefore, the constant current generation circuit 50 is also stopped.

In a case in which the control logic circuit 20 operates the constant voltage generation circuit 11, the switch 52 is also controlled such that the switch 52 is turned on. When the switch 52 is controlled such that the switch 52 is turned on, the constant current source 51 also operates and the switch 53 is also controlled such that the switch 53 is turned on. Therefore, the constant current generation circuit 50 operates.

The starting circuit 60 includes a plurality of D type flip flops 61 (for example, five flip flops). Each flip flop 61 is driven with the power supply voltage VDD or VSS and the power supply voltage VDD is input to an input terminal (D terminal) of the first flip flop 61. An output terminal (Q terminal) of the first flip flop 61 is connected to an input terminal of the second flip flop 61. Thereafter, an output terminal of each flip flop 61 is connected to an input terminal of the subsequent flip flop 61 and an output terminal of the final flip flop 61 is connected to a control terminal 113 of the constant voltage generation circuit 11. Accordingly, an output of the output terminal of the final flip flop 61 is a control signal to be input to the control terminal 113.

A clock signal output from the oscillation circuit 30 is input to a clock input terminal of each flip flop 61 and an initialization signal from an initialization signal output unit 90 to be described below is input to a reset terminal (R terminal).

When the initialization signal is input to the reset terminal, the flip flop 61 outputs an L level signal from the output terminal. Accordingly, the control signal input to the control terminal 113 is also an L level signal.

Thereafter, in accordance with a clock input, outputs are changed to the H level in sequence from the first flip flop 61. Therefore, a predetermined time until the signal is switched to the control signal with the H level after the control signal with the L level is output from the starting circuit 60 can be set in accordance with the number (stage number) of flip flops 61 and a period of the clock signal.

The initialization signal output unit 90 detecting a manipulation of the winding knob 8 and outputting the initialization signal is provided outside the semiconductor device 10. The initialization signal output unit 90 can be configured by, for example, a circuit that includes a component such as a setting lever interlocking with the winding knob 8 and a terminal of a flexible substrate or the like with which the component comes into contact when the winding knob 8 is pulled and that outputs the initialization signal when the component and the terminal come into contact with each other, that is, when the winding knob 8 is pulled.

The initialization signal output unit 90 may be configured to output the initialization signal when the winding knob 8 is turned. Further, in a case in which a button is provided as a manipulation member, the initialization signal output unit 90 may be configured to detect that the button is manipulated and outputs the initialization signal.

Control Process of Constant Voltage Generation Circuit

Next, a control process of the constant voltage generation circuit 11 according to the embodiment will be described.

When the power supply voltage is reduced, the control logic circuit 20 changes the constant voltage enable control signal into a state of an instruction to stop the constant voltage generation circuit 11, for example, to the H level. The control logic circuit 20 outputs a control signal for causing the switch 52 to be turned off to the constant current generation circuit 50.

When the signal input to the control terminal 111 becomes the H level, the constant voltage generation circuit 11 enters a stop state (is disabled). Therefore, the oscillation circuit 30 and the control logic circuit 20 also enter the stop state.

Since the control signal for causing the switch 52 to be turned off is input, the constant current generation circuit 50 is also stopped and both of the switches 41 and 53 are turned off.

When the oscillation circuit 30 is stopped, the oscillation stop detection circuit 40 outputs the oscillation stop detection signal to the control logic circuit 20.

When the oscillation circuit 30 and the control logic circuit 20 are stopped, various control circuits or the like operating with the clock signals output from the oscillation circuit 30 are also stopped and a driving circuit or the like of a step motor driving the second hand 5, the minute hand 6, and the hour hand 7 is also stopped. Therefore, movement of pointers is stopped in the electronic timepiece 1.

The control logic circuit 20 may not perform control to stop the constant voltage generation circuit 11 at the time of the reduction in the power supply voltage. In this case, for example, the second hand 5 may be moved for 2 seconds so that the user knows the reduction in the power supply voltage, and the pointer may be stopped after a certain time.

Since the movement of pointers is stopped, the user of the electronic timepiece 1 performs recharging by the power generation device 81 and further pulls the winding knob 8 to perform a manipulation of matching the pointers to a current time. When the user performs the manipulation of pulling the winding knob 8, the initialization signal output unit 90 outputs the initialization signal.

The initialization signal is input to the reset terminal of the flip flops 61 of the starting circuit 60 and the flip flops 61 are reset to output the L level signal from the output terminals. Therefore, the L level signal is input as a control signal to the control terminal 113. Since the control logic circuit 20 is stopped, no signal is input to the control terminals 111 and 112.

When the L level signal is input to the control terminal 113 in this state, the constant voltage generation circuit 11 enters an operation state (is enabled). Further, the constant voltage generation circuit 11 generates the second voltage VREG2.

Therefore, the second voltage VREG2 is applied to the oscillation circuit 30 in the stop state, and the oscillation circuit 30 starts operating early and reliably. The second voltage VREG2 is also applied to the control logic circuit 20. Therefore, the control logic circuit 20 also starts operating when a clock signal is input from the oscillation circuit 30 starting the operation.

The control logic circuit 20 starting the operation outputs a control signal for turning on the switch 52 to the constant current generation circuit 50, the constant current generation circuit 50 enters an operation state, and the switches 53 and 41 are also turned on. The control logic circuit 20 outputs a control signal to the oscillation stop detection circuit 40 so that the oscillation stop detection circuit 40 is set to enter the operation state.

In the starting circuit 60, an output of each flip flop 61 is changed to the H level in sequence whenever the clock signal is input. When outputs of all the flip flops 61 are changed to the H level, the control signal to be input to the control terminal 113 also becomes the H level.

In this case, the constant voltage generation circuit 11 is controlled in accordance with signals input from the control logic circuit 20 to the control terminals 111 and 112. That is, when the oscillation circuit 30 is oscillated and the oscillation stop detection circuit 40 detects an oscillation state, the control logic circuit 20 controls the constant voltage enable control signal to be input to the control terminal 111 such that the constant voltage enable control signal is in a state (the L level) in which the constant voltage generation circuit 11 operates. The control logic circuit 20 controls the voltage control signal to be input to the control terminal 112 in a state (the H level) that set the constant voltage generated in the constant voltage generation circuit 11 to be the first voltage VREG1. Therefore, the constant voltage generation circuit 11 is to be in a normal operation state. That is, when the winding knob 8 is manipulated from the state in which the constant voltage generation circuit 11 is stopped, the constant voltage generation circuit 11 is forcibly operated in accordance with the control signal output from the starting circuit 60 and the second voltage VREG2 is generated. When a predetermined time has passed, specifically, a time until switching of the control signal from the starting circuit 60 to the H level has passed, the constant voltage generation circuit 11 is controlled by the control logic circuit 20 and operates in a normal state in which the first voltage VREG1 is generated.

In a case in which the constant voltage generation circuit 11 normally operates, the winding knob 8 is manipulated in this state, and the initialization signal is output from the initialization signal output unit 90, the flip flops 61 of the starting circuit 60 are reset and the control signal with the L level is input to the control terminal 113. In this case, since the control signals are input from the control logic circuit 20 to the control terminals 111 and 112, the constant voltage generation circuit 11 prefers the control signal from the control logic circuit 20 and ignores the control signal input to the control terminal 113. Accordingly, the constant voltage generated by the constant voltage generation circuit 11 is not switched to the second voltage VREG2.

Even when the winding knob 8 is manipulated and the voltage is switched to the second voltage VREG2 generated in the constant voltage generation circuit 11, there is no problem in the operation.

Operational Effects of Embodiment

In the semiconductor device 10, the control logic circuit 20 which is a constant voltage control circuit controlling the constant voltage generation circuit 11 is driven in accordance with the constant voltage (the first voltage VREG1) generated by the constant voltage generation circuit 11. Therefore, the control logic circuit 20 can be driven with a voltage lower than the power supply voltage VDD, and thus power consumption can be reduced. In particular, the control logic circuit 20 is used not only to control the constant voltage generation circuit 11 but also to control various circuits such as the oscillation stop detection circuit 40 and the constant current generation circuit 50. Therefore, by driving the circuits with the first voltage VREG1, it is possible to improve the power saving effect.

When the constant voltage generation circuit 11 is stopped, the winding knob 8 is manipulated to input the initialization signal from the outside of the semiconductor device 10 so that the control signal can be output from the starting circuit 60 and the constant voltage generation circuit 11 can be forcibly operated. Accordingly, even when both of the constant voltage generation circuit 11 and the control logic circuit 20 are stopped to be in a deadlock state, the control signal can be output from the starting circuit 60 separate from the control logic circuit 20, and thus the constant voltage generation circuit 11 can be operated reliably.

Further, since the manipulation of outputting the initialization signal from the initialization signal output unit 90 is a manipulation of matching the pointers to a current time, the user may not necessarily perform a special manipulation and operability can be prevented from deteriorating.

When the constant voltage generation circuit 11 operates, the control logic circuit 20 also operates. Therefore, the starting circuit 60 may have only a function of outputting a control signal in correspondence to input of the initialization signal. Therefore, the starting circuit 60 can be configured by only the plurality of flip flops 61. Thus, even when the starting circuit 60 is driven with the power supply voltage VDD, low power consumption is used. Accordingly, when the control logic circuit 20 is driven with the first voltage VREG1 and the starting circuit 60 is driven with the power supply voltage VDD, power saving of the semiconductor device 10 can be realized compared to a case in which the control logic circuit 20 is driven with the power supply voltage VDD.

The constant voltage generation circuit 11 can generate the first voltage VREG1 for a normal operation and the second voltage VREG2 for operation start higher than the first voltage VREG1. Thus, when the control signal is input from the starting circuit 60, the second voltage VREG2 is first generated. Therefore, since the second voltage VREG2 can be applied to the oscillation circuit 30, the oscillation circuit 30 can be operated early and reliably. Since the constant voltage generation circuit 11 switches the constant voltage to be generated from the second voltage VREG2 to the first voltage VREG1 after elapse of the predetermined time in which the oscillation circuit 30 can operate reliably, the oscillation circuit 30 can be operated with the first voltage VREG1 immediately after the operation of the oscillation circuit 30 starts. Thus, power consumption can also be reduced.

Other Embodiments

The invention is not limited to the above-described embodiment, but modifications and improvements are included in the invention within the scope in which the objectives of the invention can be achieved.

For example, the invention is not limited to the case in which the constant voltage generation circuit 11 can output the first voltage VREG1 and the second voltage VREG2. The constant voltage generation circuit 11 may be able to output only the first voltage VREG1 or may also output a third voltage. That is, the constant voltage generation circuit 11 may generates a necessary constant voltage in the semiconductor device 10.

The invention is not limited to the case in which the constant voltage generation circuit 11 includes the three control terminals 111, 112, and 113. The constant voltage generation circuit 11 may include two terminals, the control terminals 111 and 112. In this case, a control signal output from the starting circuit 60 may be combined with each signal output from the control logic circuit 20 by an AND circuit to be input to the control terminals 111 and 112. That is, in a case in which the constant voltage generation circuit 11 is in the stop state, the control signal from the starting circuit 60 may be preferred. After the constant voltage generation circuit 11 operates, a signal from the control logic circuit 20 may be set to be preferred.

The invention is not limited to the case in which the control logic circuit 20 is configured by the gate array. However, when the control logic circuit 20 is configured by the gate array, there is the advantage that the control logic circuit 20 can correspond to various kinds of electronic timepieces.

The invention is not limited to the case in which the initialization signal output unit 90 outputs the initialization signal according to a manipulation of the manipulation member such as the winding knob 8. For example, the initialization signal output unit 90 may output the initialization signal according to a work of exchanging the primary battery.

In a case in which the a device generating power by winding the winding knob 8 is embedded as the power generation device 81, the initialization signal output unit 90 may be configured to output the initialization signal when a power generation state by the winding knob 8 is detected.

The electronic timepiece 1 according to the invention is not limited to an analog timepiece having pointers, but may be a timepiece that includes any of various display panels such as a liquid crystal display, an organic EL display, and an electrophoretic display.

Further, the electronic timepiece 1 according to the invention is not limited to a wristwatch, but is applicable to other timepieces such as a pocket watch, a table clock, and a wall clock and various kinds of electronic apparatuses other than the timepieces.

Furthermore, the semiconductor device (a semiconductor element or an IC) 10 of the invention may be packaged for the outside sale and manufacturers of electronic apparatuses may incorporate the semiconductor device 10 according to the invention to use it.

The entire disclosure of Japanese Patent Application No. 2015-140726, filed Jul. 14, 2015 is expressly incorporated by reference herein.

What is claimed is:

1. A semiconductor device comprising:
   a constant voltage generation circuit that is driven in accordance with a power supply;
   a constant voltage control circuit that is driven with a constant voltage generated by the constant voltage generation circuit and controls the constant voltage generation circuit; and
   a starting circuit that is different from the constant voltage control circuit and outputs a control signal to the constant voltage generation circuit to start generation of the constant voltage by the constant voltage generation circuit without a control of the constant voltage generation circuit by the constant voltage control circuit in response to an initialization signal input from outside of the semiconductor device in a case in which the constant voltage generation circuit is stopped.

2. The semiconductor device according to claim 1, further comprising:
   an oscillation circuit that is driven with the constant voltage generated by the constant voltage generation circuit,
   wherein the constant voltage generation circuit is configured to be able to switch between a first voltage and a second voltage higher than the first voltage to generate the voltage as the constant voltage, generates the second voltage when the control signal is input from the starting circuit, and switches the second voltage to the first voltage after a predetermined time passes.

3. An electronic timepiece comprising:
   the semiconductor device according to claim 1.

4. An electronic timepiece comprising:
   the semiconductor device according to claim 2.

5. The electronic timepiece according to claim 3, further comprising:
   a manipulation member; and
   an initialization signal output unit that outputs the initialization signal to the starting circuit according to a manipulation of the manipulation member.

6. The electronic timepiece according to claim 4, further comprising:
   a manipulation member; and
   an initialization signal output unit that outputs the initialization signal to the starting circuit according to a manipulation of the manipulation member.

* * * * *